(12) United States Patent
Byers et al.

(10) Patent No.: US 7,271,525 B2
(45) Date of Patent: Sep. 18, 2007

(54) PIEZOELECTRIC DEVICE MOUNTED ON INTEGRATED CIRCUIT CHIP

(75) Inventors: Charles L. Byers, Canyon Country, CA (US); Joseph H. Schulman, Santa Clarita, CA (US); Gary D. Schnittgrund, Granada Hills, CA (US)

(73) Assignee: Alfred E. Mann Foundation For Scientific Research, Santa Clarita, CA (US)

( * ) Notice: Subject to any disclaimer, the term of this patent is extended or adjusted under 35 U.S.C. 154(b) by 351 days.

(21) Appl. No.: 11/111,306

(22) Filed: Apr. 20, 2005

(65) Prior Publication Data

US 2005/0189848 A1    Sep. 1, 2005

Related U.S. Application Data

(63) Continuation-in-part of application No. 10/342,825, filed on Jan. 15, 2003, now abandoned.

(51) Int. Cl.
*H01L 41/08* (2006.01)
(52) U.S. Cl. .................. 310/330; 310/344; 310/345
(58) Field of Classification Search ........ 310/330–332, 310/340, 344, 345
See application file for complete search history.

(56) References Cited

U.S. PATENT DOCUMENTS

| | | | |
|---|---|---|---|
| 2,278,966 A * | 4/1942 | Williams | .......... 310/331 |
| 3,582,692 A * | 6/1971 | Palini | .......... 310/330 |
| 4,991,582 A | 2/1991 | Byers et al. | |
| 5,193,539 A | 3/1993 | Schulman et al. | |
| 5,193,540 A | 3/1993 | Schulman et al. | |
| 5,324,316 A | 6/1994 | Schulman et al. | |
| 5,405,476 A * | 4/1995 | Knecht | .......... 156/292 |
| 5,668,057 A | 9/1997 | Eda et al. | |
| 5,841,217 A * | 11/1998 | Kizaki et al. | .......... 310/348 |
| 6,164,284 A | 12/2000 | Schulman et al. | |
| 6,185,452 B1 | 2/2001 | Schulman et al. | |
| 6,208,894 B1 | 3/2001 | Schulman et al. | |
| 6,249,049 B1 * | 6/2001 | Kamada et al. | .......... 257/703 |
| 6,315,721 B2 | 11/2001 | Schulman et al. | |
| 6,472,991 B1 | 10/2002 | Schulman et al. | |
| 6,515,405 B1 * | 2/2003 | Kumasaka et al. | .......... 310/345 |
| 6,545,392 B2 * | 4/2003 | Kawauchi et al. | .......... 310/344 |
| 6,762,537 B1 | 7/2004 | Kikushima | |

FOREIGN PATENT DOCUMENTS

JP    09 162691 A    6/1997
WO    00/33455 A    6/2000

* cited by examiner

*Primary Examiner*—Mark Budd
(74) *Attorney, Agent, or Firm*—Gary D. Schnittgrund

(57) ABSTRACT

An electronics filter circuit includes an electromechanical resonator that is mounted directly to the surface of a silicon integrated circuit, rather than being a surface mounted or leaded filter can on a circuit board. This filter circuit allows the integrated circuit electronic package to be significantly smaller than a conventional electromechanical resonator package. The electromechanical resonator may be protected during processing and during use with a protective cover that is made of a material such as titanium. The protective cover is attached to the integrated circuit chip.

12 Claims, 4 Drawing Sheets

PIEZOELECTRIC DEVICE MOUNTED ON INTEGRATED CIRCUIT CHIP

CROSS REFERENCE TO RELATED APPLICATION

This application is a continuation-in-part of U.S. patent application Ser. No. 10/342,825, filed Jan. 15, 2003, now abandoned

FIELD OF THE INVENTION

This invention relates to high-density electronic modules, which incorporate more electronic capacity in a given space, or which reduce the space required for a given amount of electronic capacity, by placing the mechanical resonator directly on the integrated circuit chip. One of the primary uses of the present invention is to provide size reduction for integrated circuitry useful in implantable microstimulators and microsensors for implantation in living tissue.

BACKGROUND OF THE INVENTION

Most integrated circuits (ICs) and other miniature components such as oscillators, magnetic sensors, etc. are packaged in plastic or ceramic packages with solder pads or with extending metal leads for soldering to a printed circuit board or for insertion into a socket. Piezoelectric devices are common, and include electromechanical resonators, filters, sensors, and actuators. Electronic filters may be made with one or more mechanical resonators. Mechanical resonators are a key element of oscillator circuits, for example, and may be a quartz crystal, a piezoelectric crystal, an aluminum nitride bulk acoustic resonator, or a surface acoustic wave device. In most cases, a single package will only contain a single circuit component, although multiple IC chips are more commonly being manufactured within a single package. The use of such packages results in a low circuit density as the ceramic or plastic package consumes relatively large areas of the mounting surface, particularly if a socket is used.

Some of the primary considerations in developing improved high-density electronic packaging modules are:

Optimizing packing density to achieve the lowest possible volume per element, essentially the smallest module that is production worthy.

Eliminating packaging elements where possible, such as ceramic and plastic boxes and printed circuit boards, flex circuits and other substrates.

Simplifying the fabrication procedures.

Enhancing the structural strength of the elements.

Improving reliability of the electronics and of the techniques for interconnecting the electronics with the electrical leads.

Maximizing suitability for test and repair at the lowest level of assembly and throughout assembly.

Minimizing the cost per element.

A significant deterrent to reducing microcircuitry size is the electromechanical resonator. While companies, such as Statek Corporation, Orange, Calif, produce small crystals, which are one form of electromechanical resonator. The mechanical resonator packages themselves, which may be surface mounted or leaded, are relatively large. The electromechanical resonator package is generally a package comprised of metal, glass and/or ceramic that contains the crystal resonator, inverter, active element transistors, resistors, capacitors and/or inductors.

Microstimulators, as exemplified by the devices and systems described in U.S. Pat. Nos. 6,164,284, 6,185,452, 6,208,894, 6,472,991, and 6,315,721, which are incorporated herein by reference in their entirety. Microstimulators are typically elongated devices with metallic electrodes at each end that deliver electrical current to the immediately surrounding living tissue. One significant characteristic of these microstimulators is that they eliminate the need for electrical lead wires. The microelectronic circuitry and inductive coils that control the electrical current applied to the electrodes are protected from the body fluids by a hermetically sealed capsule. This capsule is typically made of rigid dielectric materials, such as glass or ceramic, that transmits magnetic fields but is impermeable to water, as well as biocompatible materials such as titanium.

An implantable miniature stimulator represents a typical application for a microstimulator. U.S. patent application Ser. No. 10/280,841, incorporated herein by reference in its entirety, presents the state of the art for crystal oscillators in these microstimulator devices. Because the microstimulator is small and leadless, it may be advantageously placed anywhere in the body of a human. Typical dimensions for this device are about 5 to 60 mm in length and about 1 to 6 mm in diameter. Obviously, the smaller the microstimulator, the more readily it may be placed in living tissue. Therefore, there is a need to reduce the size of the oscillator to enable production of smaller microcircuitry and hence smaller devices.

SUMMARY OF THE INVENTION

An integrated circuit system configured for containment within an implantable electronic microdevice, said microdevice having an axial dimension of less than 60 mm and a lateral dimension of less than 6 mm and at least two electrodes for communicating electrical signals between said microdevice and living tissue; said integrated circuit comprising an integrated circuit chip containing an electronic circuit; an electromechanical resonator cantilever mounted to and supported by said integrated circuit chip and electrically coupled to said electronic circuit; and said cantilever mounted resonator supported with an additional support that comprises a soft, flexible mounting material. The electromechanical resonator is mounted to the integrated circuit chip by at least one mounting pad. The mounting pad is an electrically conductive epoxy. The electromechanical resonator is mounted on a top surface of the integrated circuit chip, and a second crystal resonator may be mounted on a bottom surface of the integrated circuit chip. The integrated circuit chip may also be comprised of a stack of integrated circuit chips. The electromechanical resonator may be under a protective cover, which may be titanium. The novel features of the invention are set forth with particularity in the appended claims. The invention will be best understood from the following description when read in conjunction with the accompanying drawings.

OBJECTS OF THE INVENTION

It is an object of the invention to replace the electromechanical package in an electronic circuit with a direct-mounted electromechanical resonator and associated electronic circuitry on the integrated circuit substrate.

It is an object of the invention to mount a electromechanical resonator directly on a silicon chip integrated circuit.

It is an object of the invention to mount a electromechanical resonator directly on a silicon chip integrated circuit by means of gold bumping, conductive epoxy, and/or solder.

Other objects, advantages and novel features of the present invention will become apparent from the following detailed description of the invention when considered in conjunction with the accompanying drawing.

DETAILED DESCRIPTION OF THE PREFERRED EMBODIMENT

Size reduction can be achieved by eliminating the ceramic and glass box that the electromechanical resonator is normally packaged in, or by combining the oscillator integrated circuit (IC) and other appropriate circuit elements in one package. Size reduction is facilitated by having a method for mounting an electromechanical resonator directly on an IC chip. Small size offers a great benefit to electronic microdevices that are suitable for implantation in living tissue. One preferred application is the BION® device of Advanced Bionics, a Boston Scientific company, that is preferably less than 60 mm in axial length and less than 6 mm in lateral dimension or diameter, if a cylinder. Such devices are suitable for implantation by injection. U.S. Pat. Nos. 4,991,582; 5,193,539; 5,193,540; and 5,324,316 disclose such devices and are incorporated in their entirety herein by reference.

Figure 1:
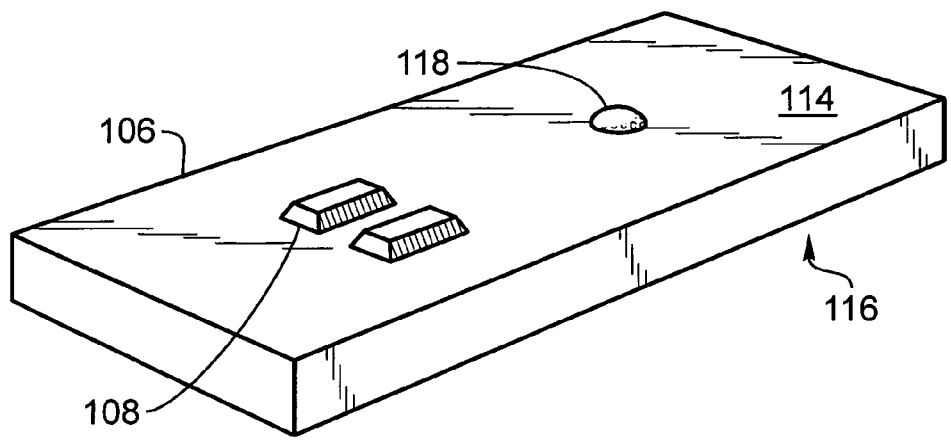
FIG. 1 presents a perspective view of an integrated circuit chip with electromechanical resonator mounting pads.

FIG. 1 provides a perspective view of a preferred embodiment of the electromechanical resonator mounting scheme. A conventional integrated circuit chip 106, which when procured typically has a thickness on the order of about 0.020 inches, and which is preferably comprised of silicon, but may be comprised of other materials, such as gallium, that are know to those skilled in the art. The integrated circuit chip 106 has at least one mounting pad 108 and preferably has two mounting pads 108 securely attached to at least one surface of the integrated circuit chip 106. In a preferred embodiment, the two mounting pads are on the top surface 114 of the integrated circuit chip 106. The top surface 114 preferably contains the integrated circuits and the circuitry that forms an oscillator circuit, as part of an electronic signal processing filter, when combined with an electromechanical resonator 110 of FIG. 2. A preferred embodiment includes an additional support 118, illustrated in FIG. 5, comprised of a soft, flexible material.

Electromechanical resonators are well known to one skilled in the art and are typically comprised of a piezoelectric material, such as quartz, that has been manufactured to have a precise and well-defined resonance frequency. The bottom surface 116 of the integrated circuit chip 106 may also contain electrical circuitry and may comprise an oscillator circuit with an electromechanical resonator 110. The electromechanical resonator 110 preferably comprises a crystal resonator, such as a piezoelectric crystal. It is also conceived that the electromechanical resonator 110 may be located on a surface of the integrated circuit chip 106 that is opposite to that on which all or a portion of the electronic circuitry is located. The electromechanical resonator circuitry includes devices that are well know to those skilled in the art, and includes various electronic components, including an inverter, active element transistors, resistors, capacitors and/or inductors.

Figure 2:
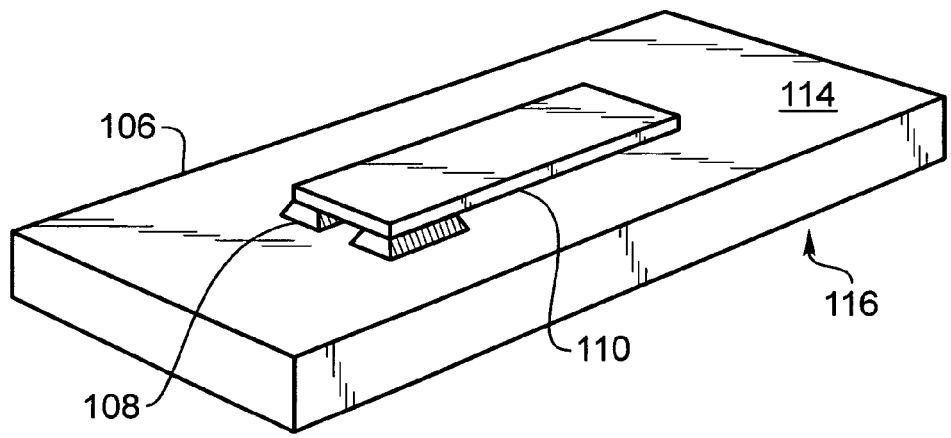
FIG. 2 presents a perspective view of an integrated circuit chip with an electromechanical resonator mounted on one surface.

The mounting pads 108, FIG. 2, are preferably electrically conductive and carry an electrical signal between the electromechanical resonator circuitry and the electromechanical resonator 110. The electrical signal is known in the art and is, at least in part, responsible for the electromechanical resonator 110 vibration. A preferred material for the mounting pads 108 is an electrically conductive epoxy, such as product number H20E from Epoxy Technology, Billerica, Mass. This preferred electrically conductive epoxy material is heat cured for one hour at about 125° C. Many other conductive adhesives are known by those skilled in the art. As illustrated in FIG. 2, the electromechanical resonator 110 is securely attached to the mounting pads 108, preferably by an electrically conductive adhesive such as H20E. Alternative mounting embodiments include using gold bumping or thick film technology of conductive materials such as gold, platinum, palladium, or combinations thereof. The electromechanical resonator is preferably cantilever mounted. It is preferred to provide an additional support 118 that is comprised of a soft, flexible mounting material, such as a low durometer silicone.

The mounting pads 108 are preferably formed directly on the integrated circuit chip 106. In an alternative embodiment, the mounting pads 108 are formed, prior to attachment to the integrated circuit chip 106, by molding and curing the electrically conductive pads in a silicone mold prior to removing them and placing them on the integrated circuit chip 106. The mounting pads 108 are positioned at a location on the integrated circuit chip 106 to establish electrical contact with the circuit on the surface of the integrated circuit chip 106.

In order to achieve a compact microcircuit it is preferred that the height of the mounting pads 108 be about 0.002 to 0.003 inches, although in alternative embodiments the mounting pads 108 may be taller or shorter. In a preferred embodiment, the mounting pads 108 determine the final distance between the integrated circuit chip 106 and the electromechanical resonator 110, which is preferably about 0.002 inches. As is well known to one skilled in the art, contact between the electromechanical resonator 110 and any other surfaces is unacceptable, although contact with the mounting pads 108 is designed to optimize performance of the electromechanical resonator 110.

Figure 3:
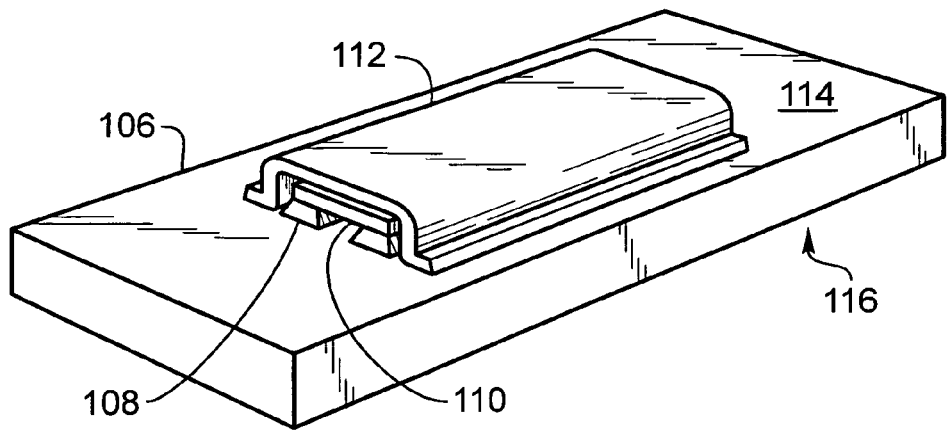
FIG. 3 presents a perspective view of an integrated circuit chip with an electromechanical resonator mounted on one surface and a protective cover over the electromechanical resonator.

As presented in FIG. 3, a protective cover 112 is preferably placed over the electromechanical resonator 110 to protect the resonator 110 during processing and during use.

It is preferred that the protective cover 112 be comprised of titanium, although any number of other materials may be used successfully. The protective cover 112 is attached to the top surface 114 of the integrated circuit by an adhesive.

Figure 4:
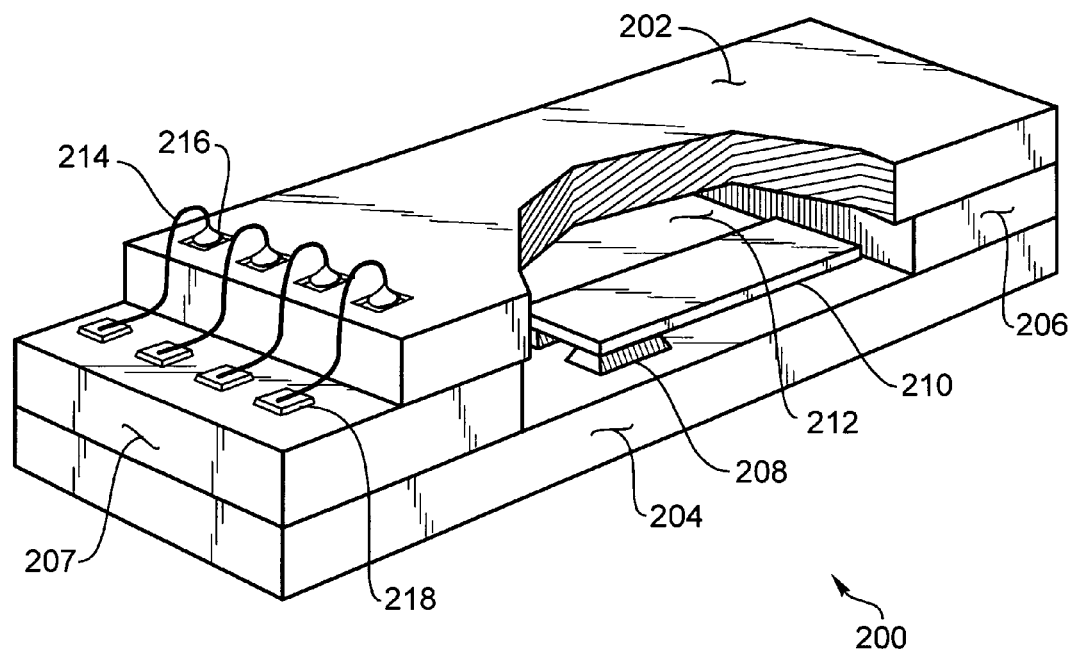
FIG. 4 is a perspective view of an integrated circuit chip stack with a cavity mounted electromechanical resonator.

An alternative embodiment is presented in FIGS. 4 to 8, wherein an electromechanical resonator 210 is preferably mounted in a cavity 212. FIG. 4 presents a chip stack 200 with the cavity 212 formed by a top integrated circuit chip 202, a bottom integrated circuit chip 204, a first intermediate integrated circuit chip 207 and a second intermediate integrated circuit chip 206. As is known to one skilled in the art, electrical signals are carried by bond wires 214, which are connected to ball bonds 216 on the top integrated circuit chip 202 and to recessed bond pads 218 on first intermediate chip 207.

Figure 5:
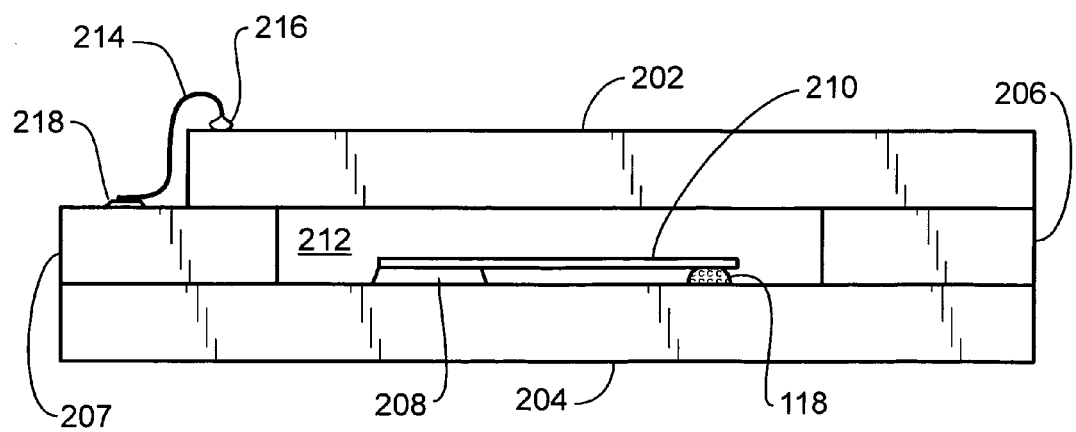
FIG. 5 is a side view of the integrated circuit chip stack of FIG. 4.

FIG. 5 presents a side view of the chip stack 200 wherein an electromechanical resonator 210 is preferably secured to mounting pads 208 in the cavity 212. An additional support 118 holds the cantilevered end of resonator 210, preventing damage during rapid acceleration, for example, while allowing it to resonate freely. Support 118 is preferably comprised of a soft, flexible mounting material, such as a low durometer silicone.

Figure 6:
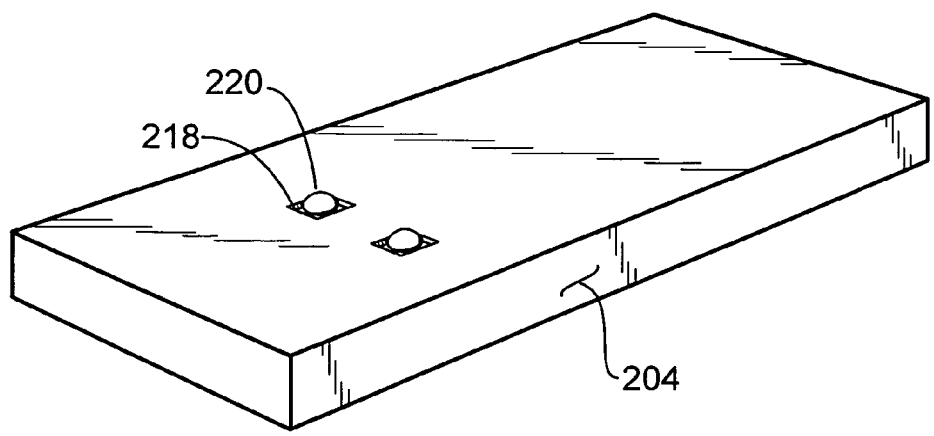
FIG. 6 is a perspective view of the bottom chip of the integrated circuit from FIG. 4.

FIG. 6 presents a preferred embodiment with the bottom chip 204 having a gold ball 220 on the bond pad 218. Alternative embodiments have gold ball 220 comprised of solder or of other materials that are known to one skilled in the art. Gold ball 220 forms an electrically conductive connection between electromechanical resonator 210 and bottom chip 204.

Figure 7:
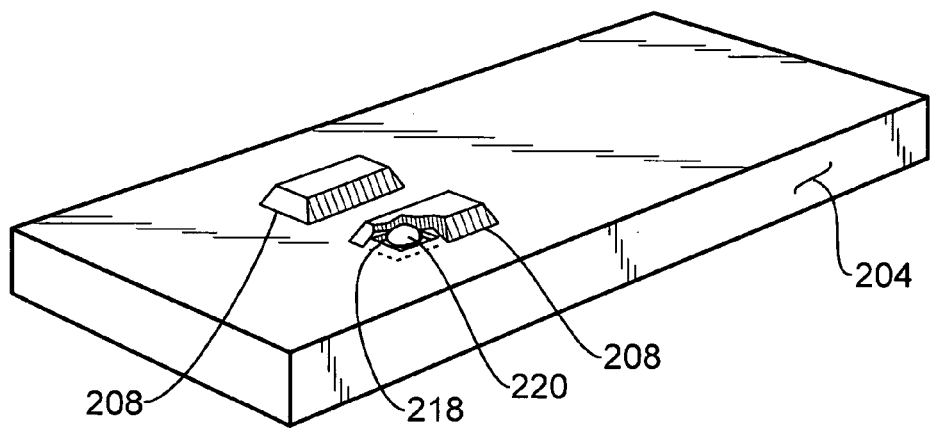
FIG. 7 is a perspective view of the bottom chip of FIG. 6 showing a cut-away view of the bond pad.

FIG. 7 presents the preferred embodiment of FIG. 6 with a cut away section through the mounting pad 208 so that the gold ball 220 can be seen in its preferred orientation on the bond pad 218.

Figure 8:
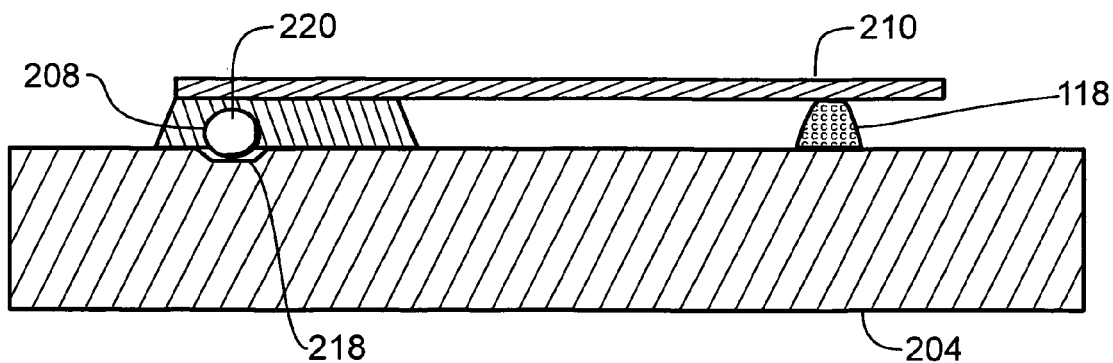
FIG. 8 is a cross-sectional view of the bond pad from FIG. 7.

FIG. 8 presents a more detailed view of the gold ball 220 forming an electrical connection between the electromechanical resonator 210 and the bond pad 218.

Figure 9:
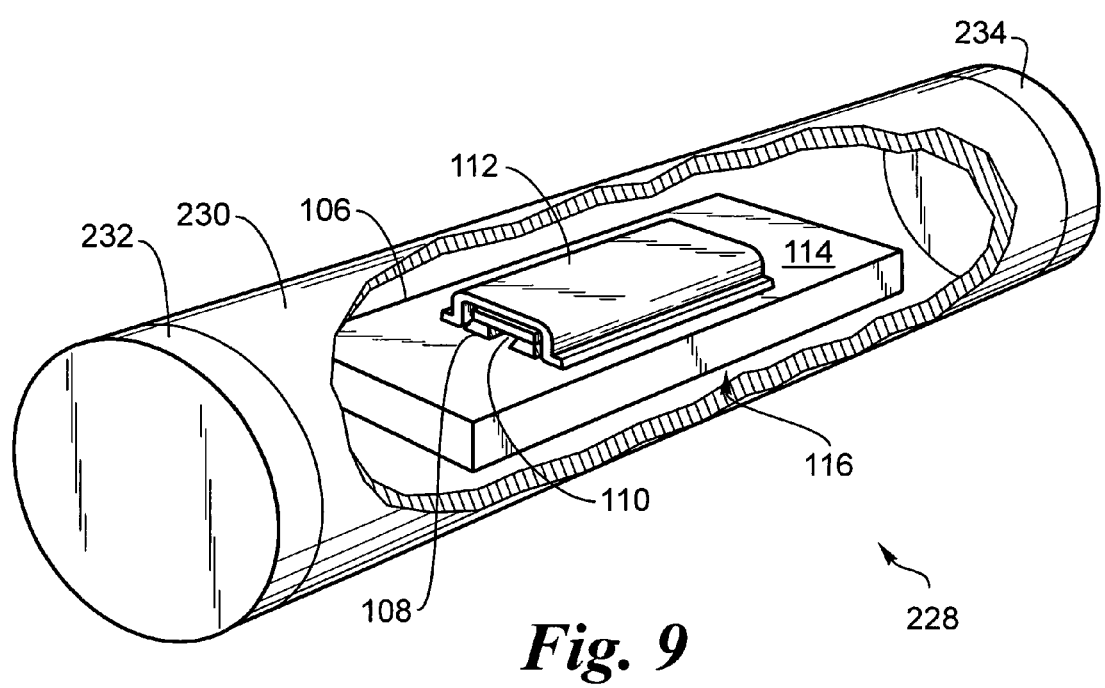
FIG. 9 is a perspective cutaway view of the bond bad in a cylindrical microdevice.

FIG. 9 presents the microdevice assembly 228 with the integrated circuit chip 106 placed inside the microdevice 228. The resonator 110 is mounted by the electrically conductive mounting pads 108, which are preferably heat cured silver. Protective cover 112 is mounted over the resonator 110 on the top surface 114 of the integrated circuit chip 106. The microdevice assembly 228 includes the electrically insulating microdevice case 230, which in a preferred embodiment is a biocompatible material, such as a ceramic material, such as alumina, titania, zirconia, stabilized-zirconia, partially-stabilized zirconia, tetragonal zirconia polycrystal, tetragonal zirconia polycrystal, magnesia-stabilized zirconia, ceria-stabilized zirconia, yttria-stabilized zirconia, calcia-stabilized zirconia, and in a preferred embodiment case 230 is tetragonal zirconia polycrystal. The microdevice case 230 is preferably a hollow right cylinder having a first microdevice electrode 232 on one end and a second microdevice electrode 234 on the opposite end that are both hermetically sealed to the microdevice case 230. The second electrode 234 is, for example, a ground electrode and the first electrode 232 is configured to be a stimulating or sensing electrode of signals in living tissue. The first electrode 232 and second electrode 234 is preferably a biocompatible electrically conductive metal, such as platinum, titanium or an alloy of titanium, preferably Ti-6Al-4V.

Obviously, many modifications and variations of the present invention are possible in light of the above teachings. It is therefore to be understood that, within the scope of the appended claims, the invention may be practiced otherwise than as specifically described.

What is claimed is:

1. An integrated circuit system configured for containment within an implantable electronic microdevice, said microdevice having an axial dimension of less than 60 mm and a lateral dimension of less than 6 mm and at least two electrodes for communicating electrical signals between said microdevice and living tissue; said integrated circuit comprising:

an integrated circuit chip containing an electronic circuit;

an electromechanical resonator cantilever mounted to and supported by said integrated circuit chip and electrically coupled to said electronic circuit; and said cantilever mounted resonator supported with an additional support that comprises a soft, flexible mounting material.

2. The integrated circuit system according to claim 1 wherein said additional support is comprised of silicon.

3. The integrated circuit system according to claim 1 wherein said at least one mounting pad is a gold bump.

4. The integrated circuit system according to claim 1 wherein said at least one mounting pad is electrically conductive.

5. The integrated circuit system according to claim 1 wherein said at least one mounting pad comprises an electrically conductive epoxy.

6. The integrated circuit system according to claim 1 wherein said at least one electromechanical resonator comprises quartz.

7. The integrated circuit system according to claim 1 wherein said electronic circuit is at least partially comprises an oscillator circuit.

8. The integrated circuit system according to claim 1 wherein said integrated circuit chip has a top surface and a bottom surface and at least one electromechanical resonator is mounted on said top surface.

9. The integrated circuit system according to claim 1 wherein said integrated circuit chip has a top surface and a bottom surface and at least one electromechanical resonator is mounted on said top surface of said integrated circuit chip and a second electromechanical resonator is mounted on said bottom surface of said integrated circuit chip.

10. The integrated circuit system according to claim 1 wherein said protective cover comprises titanium.

11. The integrated circuit system according to claim 1 wherein said microdevice is comprised of a biocompatible ceramic.

12. The integrated circuit system according to claim 1 wherein said electrodes are comprised of titanium or a titanium alloy.

* * * * *